US010209274B2

(12) United States Patent
Vedagarbha et al.

(10) Patent No.: US 10,209,274 B2
(45) Date of Patent: Feb. 19, 2019

(54) LASER-ASSISTED DEVICE ALTERATION USING SYNCHRONIZED LASER PULSES

(71) Applicant: FEI EFA, Inc., Fremont, CA (US)

(72) Inventors: Praveen Vedagarbha, Fremont, CA (US); Derryck Reid, West Lothain (GB); Keith Serrels, Fremont, CA (US); James S. Vickers, San Jose, CA (US)

(73) Assignee: FEI EFA, Inc., Fremont, CA (US)

( * ) Notice: Subject to any disclaimer, the term of this patent is extended or adjusted under 35 U.S.C. 154(b) by 174 days.

(21) Appl. No.: 14/922,046

(22) Filed: Oct. 23, 2015

(65) Prior Publication Data

US 2016/0202313 A1    Jul. 14, 2016

Related U.S. Application Data

(63) Continuation of application No. 13/896,262, filed on May 16, 2013, now Pat. No. 9,201,096, which is a
(Continued)

(51) Int. Cl.
*G01R 1/07* (2006.01)
*G01R 31/26* (2014.01)
(Continued)

(52) U.S. Cl.
CPC .............. *G01R 1/07* (2013.01); *G01R 31/26* (2013.01); *G01R 31/311* (2013.01); *G01R 31/30* (2013.01); *G01R 31/31917* (2013.01)

(58) Field of Classification Search
CPC ......... G01R 1/07; G01R 31/26; G01R 31/311
See application file for complete search history.

(56) References Cited

U.S. PATENT DOCUMENTS 5,095,262 A    3/1992  Henley et al.
5,270,643 A   12/1993  Richardson et al.
(Continued)

FOREIGN PATENT DOCUMENTS

CN    1592854    3/2005
CN  101105519    1/2008
(Continued)

OTHER PUBLICATIONS

Rowlette J. A. et al., Near-IR Laser-Based "Tuning" of 50 nm Transistors. The 16th Annual Meeting of the IEEE Lasers and Electro-Optics Society, 2003. LEOS 2003, Jan. 8, 2004, vol. 2, pp. 664-665.
(Continued)

*Primary Examiner* — Jeff W Natalini
(74) *Attorney, Agent, or Firm* — Klarquist Sparkman, LLP

(57) ABSTRACT

A pulsed-laser LADA system is provided, which utilizes temporal resolution to enhance spatial resolution. The system is capable of resolving CMOS pairs within the illumination spot using synchronization of laser pulses with the DUT clock. The system can be implemented using laser wavelength having photon energy above the silicon bandgap so as to perform single-photon LADA or wavelength having photon energy below the silicon bandgap so as to generate two-photon LADA. The timing of the laser pulses can be adjusted using two feedback loops tied to the clock signal of an ATE, or by adjusting the ATE's clock signal with reference to a fixed-pulse laser source.

14 Claims, 4 Drawing Sheets

Related U.S. Application Data continuation-in-part of application No. 13/228,369, filed on Sep. 8, 2011, now Pat. No. 8,860,447.

(60) Provisional application No. 61/381,023, filed on Sep. 8, 2010, provisional application No. 61/648,042, filed on May 16, 2012.

(51) Int. Cl.
    *G01R 31/311* (2006.01)
    *G01R 31/319* (2006.01)
    *G01R 31/30* (2006.01)

(56) References Cited

U.S. PATENT DOCUMENTS

| | | | |
|---|---|---|---|
| 5,430,305 A | 7/1995 | Cole, Jr. et al. | |
| 5,546,011 A | 8/1996 | Takahashi et al. | |
| 5,854,804 A | 12/1998 | Winer et al. | |
| 6,078,183 A | 6/2000 | Cole, Jr. | |
| 6,316,950 B1 | 11/2001 | Denk et al. | |
| 6,400,165 B1 | 6/2002 | Knox et al. | |
| 6,842,866 B2 | 1/2005 | Song et al. | |
| 6,882,170 B2* | 4/2005 | Eiles | G01R 31/3161 324/750.03 |
| 6,897,664 B1* | 5/2005 | Bruce | G01R 31/311 324/754.23 |
| 6,967,491 B2 | 11/2005 | Perdu et al. | |
| 7,038,474 B2 | 5/2006 | McGinnis et al. | |
| 7,516,379 B2 | 4/2009 | Rohrbaugh et al. | |
| 7,679,358 B2 | 3/2010 | Kasapi et al. | |
| 7,872,489 B2 | 1/2011 | Dickson et al. | |
| 8,115,170 B2 | 2/2012 | Stellari et al. | |
| 8,860,447 B2 | 10/2014 | Vedagarbha et al. | |
| 9,201,096 B2 | 12/2015 | Vedagarbha et al. | |
| 2002/0039030 A1* | 4/2002 | Khazei | G01R 29/0871 324/754.29 |
| 2003/0098692 A1 | 5/2003 | Cotton et al. | |
| 2004/0083407 A1 | 4/2004 | Song et al. | |
| 2005/0006602 A1 | 1/2005 | Perdu et al. | |
| 2005/0025425 A1 | 2/2005 | Tuck | |
| 2005/0046936 A1* | 3/2005 | Dixon | G02B 26/101 359/385 |
| 2006/0066325 A1* | 3/2006 | McGinnis | G01R 31/311 324/754.23 |
| 2007/0002328 A1 | 1/2007 | Woods et al. | |
| 2008/0088324 A1* | 4/2008 | Desplats | G01R 31/311 324/754.23 |
| 2008/0164414 A1 | 7/2008 | Stellari et al. | |
| 2008/0238435 A1 | 10/2008 | Bockelman et al. | |
| 2009/0213879 A1 | 8/2009 | Stadler et al. | |
| 2009/0261840 A1 | 10/2009 | Erington et al. | |
| 2009/0271675 A1 | 10/2009 | Dickson et al. | |
| 2010/0117667 A1* | 5/2010 | Lo | G01R 31/311 324/754.23 |
| 2010/0156451 A1* | 6/2010 | Chua | G01R 31/311 324/754.23 |
| 2010/0231253 A1* | 9/2010 | Kitagawa | G01R 31/311 324/754.23 |
| 2010/0312517 A1 | 12/2010 | McNamara et al. | |
| 2012/0056626 A1 | 3/2012 | Vedagarbha et al. | |
| 2013/0314116 A1 | 11/2013 | Vedagarbha et al. | |
| 2014/0285227 A1 | 9/2014 | Serrels et al. | |
| 2016/0202313 A1 | 7/2016 | Vedagarbha et al. | |

FOREIGN PATENT DOCUMENTS

| | | |
|---|---|---|
| CN | 102401632 | 4/2012 |
| EP | 0878841 | 11/1998 |
| EP | 2428807 | 3/2012 |
| JP | H 02-176479 | 7/1990 |
| JP | H 10-332794 | 12/1998 |
| JP | 2004-128113 | 4/2004 |
| JP | 2005-228994 | 8/2005 |
| JP | 2006-24774 | 1/2006 |
| JP | 2008-300486 | 12/2008 |
| JP | 2010-133958 | 6/2010 |
| JP | 2010-181288 | 8/2010 |
| JP | 2010-271307 | 12/2010 |
| JP | 2011-75441 | 4/2011 |
| JP | 2012-058247 | 3/2012 |
| JP | 2015-517667 | 6/2015 |
| JP | 5873669 | 1/2016 |
| SG | 179362 | 4/2012 |
| TW | 2009-37504 | 9/2009 |
| TW | 2009-44821 | 11/2009 |
| TW | 201211561 | 3/2012 |
| TW | 500926 | 9/2012 |
| TW | 201411157 | 3/2014 |
| TW | 1440869 | 6/2014 |
| TW | 201447335 | 12/2014 |
| TW | I479167 | 4/2015 |
| WO | WO 2009/013419 | 1/2009 |
| WO | WO 2013/188046 | 12/2013 |
| WO | WO 2014/160618 | 10/2014 |

OTHER PUBLICATIONS

Search Report and Examination Report for Singapore Patent Application No. 10201507213U dated Sep. 19, 2017, pp. 1-9.
Bautista, G. S., Jr. et al., "Two-Photon Optical Beam-Induced Current Microscopy of Light-Emitting Diodes," Science Diliman, Jul.-Dec. 2004, 16:2, pp. 61-65.
Bruce et al., Soft defect localization (SDL) in ICs. ASM International Symposium for Testing and Failure Analysis—28th Annual, ASM International, Phoenix, AZ, 21-27 (2002).
Buchner, S. et al., Pulsed-Laser Testing Methodology for Single Event Transients in Linear Devices. IEEE Trans. Nuclear Science, vol. 51, No. 6, Dec. 2004, pp. 3716-3722.
Chong et al., "All-normal-dispersion femtosecond fiber laser with pulse energy above 20 nJ," Optics Letters, 32(16):2408-2410 (Aug. 15, 2007).
Decision to Grant for Japanese Patent Application No. 2015-512867 dated Aug. 1, 2017.
Douin, "Influence of Laser Pulse Duration in Single Event Upset Testing," IEEE Transactions on Nuclear Science, 53(4):1799-1805 (Aug. 2006).
Douin et al., "Time resolved imaging using synchronous picosecond Photoelectric Laser Stimulation," Microelectronic Reliability, 46:1514-1519 (Sep. 2006).
Erington et al., "Software Enhanced Time Resolved Laser Assisted Device Alteration with a Non-Pulsed Laser Source," ASM International Symposium for Testing and Failure Analysis—35th Annual, ASM International, San Jose, CA, pp. 43-51 (2002).
Examination Report and Search Report for Taiwanese Patent Application No. 102117339 dated Aug. 29, 2014.
Examination Report for Taiwanese Patent Application No. 103110836 dated Mar. 9, 2016.
Extended European Search Report for European Patent Application No. 11180399.5 dated Sep. 29, 2014.
Final Office Action for related U.S. Appl. No. 14/222,556, dated Oct. 14, 2016, 34 pages.
Huang, M., "The Applications of Two-photon Confocal Microscopy and Micro-spectroscopy: OBIC imaging of InGaN LEOs and their Micro-spectra," Master thesis, National Sun Yat-Sen University, Institute of Physics, Jun. 2000; 56 pages.
International Preliminary Report on Patentability for PCT/US2013/041468 dated Nov. 27, 2014.
International Preliminary Report on Patentability for PCT/US2014/031523 dated Oct. 8, 2015.
International Search Report and Written Opinion for PCT/US2013/041468 dated Nov. 14, 2013.
International Search Report and Written Opinion for PCT/US2014/031523 dated Aug. 12, 2014.
Invitation to Respond to Written Opinion for Singapore Patent Application No. 10201507213U dated Feb. 11, 2016.

(56) References Cited

OTHER PUBLICATIONS

Kiyan, T. et al., "Dynamic Analysis of Tester Operated Integrated Circuits Stimulated by Infra-Red Lasers", Mar. 23, 2010, 139 pages, Berlin.
Kiyan et al., "Timing Characterization of a Tester Operated Integrated Circuit by Continuous and Pulsed Laser Stimulation," Proceedings from the 36th International Symposium of Testing and Failure Analysis, pp. 211-216 (Nov. 14-18, 2010).
Lewis et al., "Backside Laser Testing of ICs for SET Sensitivity Evaluation," IEEE Transactions on Nuclear Science, 48(6):2193-2201 (Dec. 2001).
McMorrow et al., "Subbandgap Laser-Induced Single Event Effects: Carrier Generation via Two-Photon Absorption," IEEE Transactions on Nuclear Science, 49(6):3002-3008 (Dec. 2002).
McMorrow, "Three-dimensional mapping of single-event effects using two-photon absorption," IEEE Transactions on Nuclear Science, 50, 2003; 9 pages.
Melinger et al., "Critical Evaluation of the Pulsed Laser Method for Single Event Effects Testing and Fundamental Studies," IEEE Transactions on Nuclear Science, 41(6):2574-2584 (Dec. 1994).
Moss et al., "Correlation of Picosecond Laser-Induced Latchup and Energetic Particle-Induced Latchup in CMOS Test Structures," IEEE Transactions on Nuclear Science, 42(6):1948-1955 (Dec. 1995).
Niu, B. et al., "Two-Photon Absorption Laser Assisted Device Alteration Using 1340nm CW Laser: Critical Timing Fault Isolation & Localization for 32nm MPU and Beyond," ASM International, Proceedings from the 36th International Symposium for Testing and Failure Analysis, Nov. 14-18, 2010, pp. 224-230.
Notice of Allowance for Japanese Patent Application No. 2011-195895 dated Jan. 5, 2016.
Notice of Allowance for Taiwanese Patent Application No. 100132283 dated May 5, 2014.
Notice of Allowance for Taiwanese Patent Application No. 102117339 dated Jan. 21, 2015.
Notice of Allowance for U.S. Appl. No. 13/228,369 dated Jun. 5, 2014.
Notice of Allowance for U.S. Appl. No. 13/896,262 dated Jul. 24, 2015.
Notice of Intention to Refuse Patent Application for Singapore Patent Application No. 10201507213U dated Jul. 26, 2016.
Notice of Reasons for Refusal for Japanese Patent Application No. 2015-512867 dated Dec. 27, 2016.
Notice of Reasons for Rejections for Japanese Patent Application No. 2011-195895 dated May 12, 2015.
Office Action for Chinese Patent Application No. 201110319332.2 dated Feb. 17, 2015.
Office Action for Chinese Patent Application No. 201110319332.2 dated Nov. 11, 2015.
Office Action for Chinese Patent Application No. 201110319332.2 dated Mar. 7, 2016.
Office Action and Search Report for Taiwanese Patent Application No. 100132283 dated Oct. 21, 2013.
Office Action for Taiwanese Patent Application No. 102117339 dated Aug. 29, 2014.
Office Action for U.S. Appl. No. 13/228,369 dated Jan. 24, 2014.
Office Action for U.S. Appl. No. 13/896,262 dated Mar. 11, 2015.
Office Action for related U.S. Appl. No. 14/222,556, dated May 31, 2016, 21 pages.
Office Action for related U.S. Appl. No. 14/222,556, dated Oct. 16, 2017, 22 pages.
Pan, E., et al., "Application of Two-Photon-Absorption Photopolymerization to Micro-Device Fabrication," Journal of CCIT, vol. 34, No. 1, Nov. 2005, pp. 1-16.

Pouget et al., "Dynamic Testing of an SRAM-based FPGA by Time-Resolved Laser Fault Injection," 14th IEEE International On-Line Testing Symposium, pp. 295-301 (2008).
Pouget et al, Fundamentals of laser SEE testing and recent trends, Radiation Analysis Laser Facilities Day (RALFDAY), (2009).
Pouget et al., "Picosecond Single-Photon and Femtosecond Two-Photon Pulsed Laser Stimulation for IC Characterization and Failure Analysis," ISTFA 2009 Conference Proceedings from the 35th International Symposium for Testing and Failure Analysis, Nov. 15-19, 2009, pp. 268-271; 2009 ASM International, San Jose CA.
Pouget et al., Time-Resolved Scanning of Integrated Circuits with a Pulsed Laser: Application to Transient Fault Injection in an ADC, IEEE Transactions on Instrumentation and Measurement, 53(4):1227-1231 (Aug. 2004).
Pouget et al., "Tools and methodology development for pulsed laser fault injection in SRAM-based FPGAs," 8th Latin-American Test Workshop, 7 pages (2007).
Pouget, V., "Using Pulsed Lasers for Security Purpose," Aug. 6, 2007, pp. 1-24, http://hal.archives-ouvertes.fr/hal-00401384/en/.
Rostami et al., "A Proposal for Fast Optical Switch using Two-photon Absorption Coupled Ring-resonator to MZI". IEEE, 2005, pp. 66-69.
Rowlette, J. A., et al., Critical timing analysis in microprocessors using near-IR laser assisted device alteration (LADA). 1TC International Test Conference; IEEE, 2003, pp. 264-273, Charlotte, NC.
Sanchez et al., "NIR laser stimulation for dynamic timing analysis," Microelectronics Reliability, 45(9-11):1459-1464 (Sep.-Nov. 2005).
Search Report and Written Opinion for Singapore Patent Application No. 10201507213U dated Jan. 15, 2016.
Search Report for Taiwanese Patent Application No. 103110836 dated Jan. 21, 2016.
Serrels et al., 70nm resolution in subsurface optical imaging of silicon integrated-circuits using pupil-function engineering. Appl. Phys. Lett. 94, 073113 (2009), 3 pages; 2009 American Institute of Physics.
Serrels et al., Nanoscale optical microscopy in the vectorial focusing regime. Nature photonics | Advance Online Publication | www.nature.com/naturephotonics; Mar. 9, 2008; 4 pages; 2008 Nature Publishing Group.
Serrels K. A. et al., Solid-immersion lens applications for nanophotonic devices. Journal of Nanophotonics, vol. 2, 021854 (2008); Dec. 19, 2008; pp. 1-29.
Serrels et al., "Solid-immersion-lens-enhanced nonlinear frequency-variation mapping of a silicon integrated-circuit," Applied Physics Letters, 99:193103-01-193103-03 (Nov. 2011).
Serrels, K. A. et al., "Two-Photon X-Variation Mapping Based on a Diode-Pumped Femtosecond Laser," 2010 ASM International; Proceedings from the 36th International Symposium for Testing and Failure Analysis, Nov. 14-18, 2010, pp. 14-19.
Serrels, K. A. et al., "Two-Photon X-Variation Mapping Based on a Diode-Pumped Femtosecond Laser," Emerging FA Technologies & Concepts, ISTFA, Nov. 16-18, 2010; 19 pages; DCG Systems.
"Shao et al," Comparison of classical and Two-photon Photoelectric Laser Stimulation Capabilities for Failure Analysis, Proceedings of IEEE International Symposium on the Physical and Failure Analysis of Integrated Circuits (IPFA), (Jul. 4-7, 2011).
Supplemental Notice of Allowance for U.S. Appl. No. 13/228,369 dated Jul. 15, 2014.
Supplemental Notice of Allowance for U.S. Appl. No. 13/228,369 dated Sep. 16, 2014.
Supplemental Notice of Allowance for U.S. Appl. No. 13/896,262 dated Sep. 14, 2015.
Tsang et al., Picosecond imaging circuit analysis; IBM J. Res. Develop., Jul. 2000, vol. 44, No. 4; pp. 583-603.

* cited by examiner

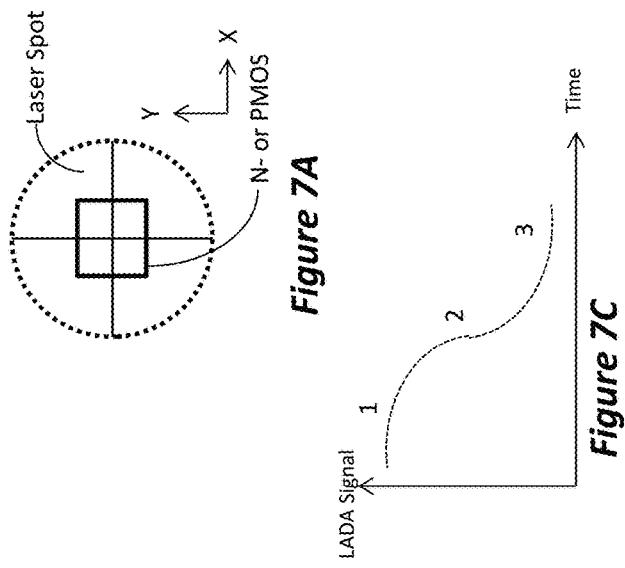
Figure 7A
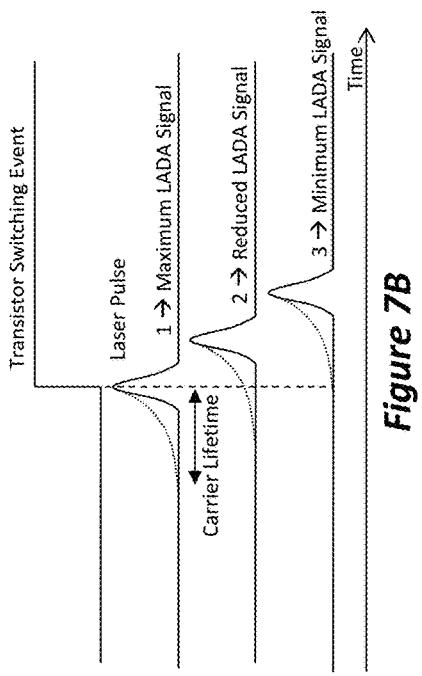
Figure 6
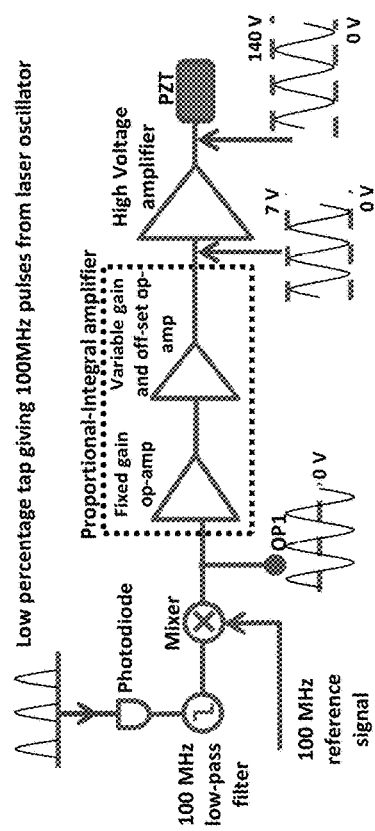
Figure 7C
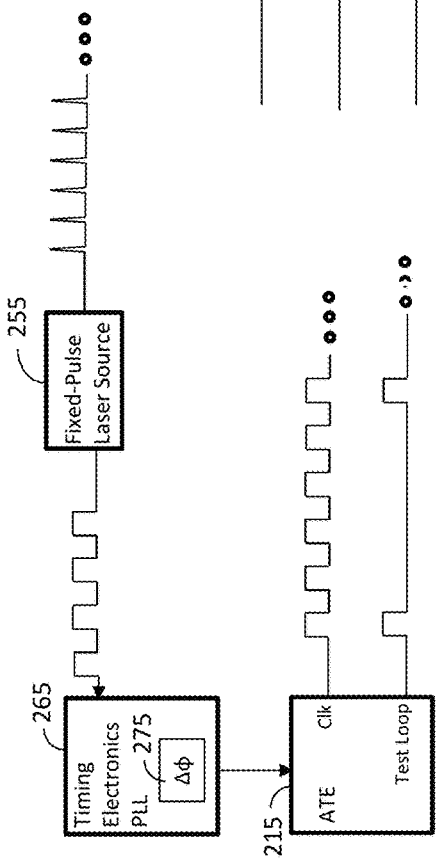
Figure 7B
Figure 2B

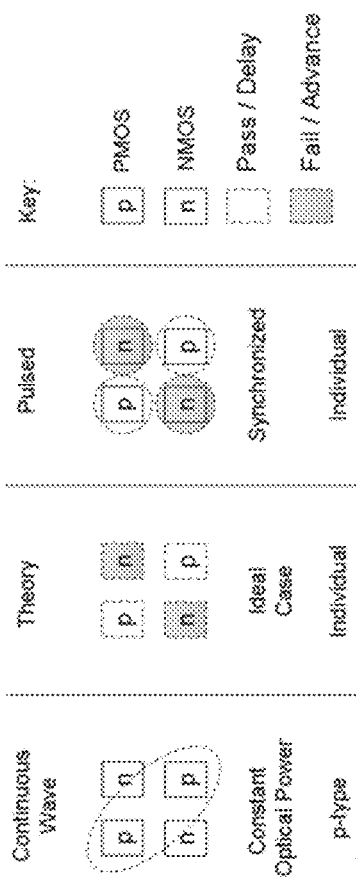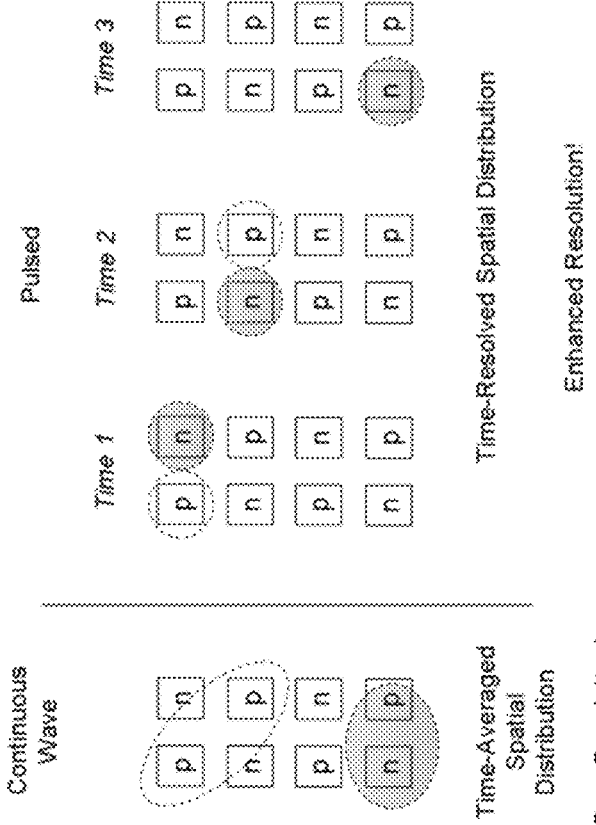

LASER-ASSISTED DEVICE ALTERATION USING SYNCHRONIZED LASER PULSES

CROSS-REFERENCE TO RELATED APPLICATIONS

This Application is a Continuation Application of U.S. patent application Ser. No. 13/896,262, filed on May 16, 2013, which is a Continuation-in-Part of U.S. patent application Ser. No. 13/228,369, filed on Sep. 8, 2011, which claims priority benefit from U.S. Provisional Application No. 61/381,023, filed on Sep. 8, 2010, the disclosures of which are incorporated herein by reference in their entirety. U.S. patent application Ser. No. 13/896,262 also claims priority benefit from U.S. Provisional Application No. 61/648,042, filed on May 16, 2012, the disclosure of which is incorporated herein in its entirety.

GOVERNMENT LICENSE RIGHTS

This invention was made with government support under USAF Contract FA8650-11-C-7104 awarded by IARPA. The government has certain rights in the invention.

BACKGROUND

1. Field of Invention

This invention is in the field of laser-based defect localization analysis of integrated circuits (IC). More specifically, this invention is about design debug and/or failure analysis of ICs using the laser assisted device alteration (LADA) technique.

2. Related Art

LADA (Laser-Assisted Device Alteration) is a technique that depends on the ability of a continuous-wave (CW) laser to generate localized photocurrents in an integrated circuit through its backside and thus change the pass/fail outcome of a test stimulus on a "sensitive" transistor, thereby localizing sensitive areas including design or process defects. The laser is used to temporarily alter the operating characteristics of transistors on the device. The current spatial resolution using the 1064 nm continuous wave laser is 240 nm.

An explanation of the LADA techniques can be found in, for example, Critical Timing Analysis in Microprocessors Using Near-IR Laser Assisted Device Alteration (LADA), Jeremy A. Rowlette and Travis M. Eiles, International Test Conference, IEEE Paper 10.4, pp. 264-273, 2003. That paper described the possibility of using a CW laser of 1064 nm or 1340 nm wavelength. It is explained that the 1340 nm would cause device alteration via localized heating, while the 1064 nm would cause device alteration via photocurrent generation. It is also noted that the 1064 nm laser has a spatial resolution advantage. Therefore, the authors recommend the use of 1064 nm laser.

As shown in FIG. 1, conventional LADA uses a CW laser to induce electron-hole pairs in the device under test from the backside. The electron-hole pairs so generated affect the timing of the nearby transistor—thus facilitating critical path analysis. A DUT 110 is coupled to a tester 115, e.g., a conventional Automated Testing Equipment (ATE), which is connected to computer 150. The ATE is used in a conventional manner to stimulate the DUT with test vectors and study the response of the DUT to the test vectors. The response of the DUT to the test vectors can be further investigated using the LADA. For example, if the DUT fails a certain test, LADA can be used to investigate whether the DUT can pass under certain conditions and, if so, which device, i.e., transistor, was responsible for the failure. Conversely, when the DUT passes certain tests, LADA can be used to investigate under which conditions the DUT will fail these tests and, if so, which device, i.e., transistor, was responsible for the failure.

The LADA system for FIG. 1 operates as follows. Tiltable mirrors 130 and 135 and objective lens 140 are used to focus and scan a beam from CW laser 120 onto the DUT 110. This allows the laser 120 to generate photo carriers in the silicon of the DUT without resulting in localized heating of the device. The electron-hole pairs so generated affect the timing of the nearby transistor, i.e., decreasing or increasing transistor switching time. The tester is configured to place the operating point of the device under test in a marginal state by applying a recurrent test loop of selected voltage and frequency. The laser stimulation is then used to change the outcome of the tester's pass/fail status. The beam's location at each point is correlated to the pass/fail outcome of the tester, so that when a change is detected, i.e., a previously passing transistor is now failing or vice versa, the coordinates of the laser beam at that time points to the location of the "borderline" transistor.

During the LADA analysis, the tester (ATE) is configured to place the operating point of the device under test in a marginal state. The laser stimulation is used to change the outcome of the tester's pass/fail status. The present state-of-the-art in laser assisted fault spatial localization is about 240 nm resolution. The limitation on further improvement of the single photon LADA spatial resolution is imposed by the laser light wavelength. As noted in the Rowlette paper, the spatial resolution is enhanced by using shorter wavelength. However, optical absorption of silicon at wavelength smaller than 1064 nm prevents the use of shorter wavelengths, as it becomes the major obstacle for delivering light to the transistor through the backside. Thus, while design rules of modern devices shrink, the spatial resolution of the LADA system cannot be improved by the use of smaller wavelength laser. For example, at 22 nm design rule it is doubtful that conventional LADA will be able to resolve among four neighboring transistors.

Optical beam induced current (OBIC) is another test and debug analysis in which laser beam is illuminating the DUT. However, unlike LADA, OBIC is a static test, meaning no stimulus signal is applied to the DUT. Instead, the laser beam is used to induce current in the DUT, which is then measured using low-noise, high-gain voltage or current amplifiers. OBIC has been used in a single-photon mode and in a two-photon absorption mode, sometimes referred to as TOBIC or 2P-OBIC (two-photon optical beam induced current).

Two-photon absorption (TPA) is the simultaneous absorption of two photons of identical or different frequencies in order to excite a molecule from one state (usually the ground state) to a higher energy electronic state. The wavelength is chosen such that the sum of the photon energy of two photons arriving at the same time is equal to the energy difference between the involved lower and upper states of the molecule. Two-photon absorption is a second-order process, several orders of magnitude weaker than linear (single-photon) absorption. It differs from linear absorption in that the strength of absorption depends on the square of the light intensity, thus it is a nonlinear optical process.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments disclosed enable higher spatial resolution of fault localization by utilizing time domain to enable enhanced spatial resolution. Disclosed embodiments utilize a pulsed laser with sufficient energy in lieu of a continuous wave laser. The pulsed laser is synchronized to the device's clock, thus enabling improved spatial resolution. Various embodiments utilize a 1064 nm wavelength laser for a single-photon LADA, or longer wavelengths so as to exploit the non-linear two-photon absorption mechanism to induce LADA effects. This later technique is referred to herein as Two-Photon Laser Assisted Device Alteration technique (2pLADA).

Disclosed embodiments enable higher resolution of fault localization by using test vectors stimulating a DUT and at the same time use a femtosecond pulsed laser to scan an area of interest in the DUT and examine the response of the DUT to the test vectors during the scan. The laser source is chosen such that the wavelength provides photon energy below the band gap of silicon and it provides pulses of femtosecond pulse width. A clock signal is obtained from the ATE and is fed to the DUT and to the circuit controlling the pulsed laser. The timing of the pulses can be shifted relating to the ATE clock, so as to investigate the pass/fail characteristics of various devices. Additionally, by using proper synchronization of the laser pulses to the clock, spatial resolution is enhanced to enable resolving multiple devices, i.e., transistors, within the laser beam.

In alternative embodiments, a fixed pulse laser system is used. The clock of the fixed pulse laser is sent to the ATE and is used to derive the test signals to the DUT. Moreover, in order to achieve the effect of shifting the timing of the pulses relative to the test signal, the clock signal of the fixed pulsed laser is shifted prior to sending it to the ATE. Consequently, as the ATE generates the test signals based on the shifted laser clock, the test signal itself is shifted relative to the laser pulses. By controlling the shift of the laser clock, the test signals are shifted relative to the laser pulses to enable the LADA investigation.

Various embodiments provide a laser assisted device alteration (LADA) system operable in conjunction with an automated testing equipment (ATE) for testing integrated circuit device under test (DUT), comprising: a controller receiving and analyzing test signals from the ATE; timing electronics receiving a clock signal from the ATE, the timing electronics including a first feedback loop generating a synch signal for synchronization of laser pulses to the clock signal; a tunable pulsed laser source generating the laser pulses and having a tunable laser cavity and having a second feedback loop to control the tunable laser cavity so as to generate desired pulse rate of the laser pulses; optical arrangement receiving laser pulses from the tunable pulsed laser source and directing the laser pulses onto desired location on the DUT; wherein the timing electronics is configured for timing the laser pulses to arrive at transistors in the DUT at times synchronized to the clock time to thereby alter the transistors response to test signals applied to the DUT from the ATE, and wherein the controller is configured to detect the altered transistors response. The first feedback loop and/or the second feedback loop may comprise phase-locked loop. The optical arrangement may comprise a laser scanning microscope. The optical arrangement may further comprise a solid immersion lens. The pulse rate of the laser pulses may be configured as a multiple of the clock signal. The multiple may be an integer larger than one or a fraction. The timing electronics may be configured to delay or advance the laser pulses with respect to the clock signal.

According to further embodiments, a laser assisted device alteration (LADA) system operable in conjunction with an automated testing equipment (ATE) for testing integrated circuit device under test (DUT) is provided, comprising: a controller receiving and analyzing test signals from the ATE; a fixed pulsed laser source generating laser pulses and generate pulse rate signal indicative of pulse rate of the laser pulses; timing electronics receiving the pulse rate signal and sending a clock signal to the ATE; optical arrangement receiving laser pulses from the fixed pulsed laser source and directing the laser pulses onto desired location on the DUT; wherein the timing electronics is configured for adjusting the timing test signals output by the ATE to arrive at transistors in the DUT at times synchronized to the laser pulses, to thereby detect whether the laser pulses alter the transistors response to the test signals applied to the DUT from the ATE, and wherein the controller is configured to detect the altered transistors response.

The timing electronics may further comprise a variable phase circuit configured to vary the phase of the clock signal with respect to the pulse rate signal. The variable phase circuit may be configured to retard or advance the test signals with respect to the pulse rate signal.

According to yet further embodiments, a method for testing an integrated device under test (DUT) that is coupled to an automated testing equipment (ATE) using laser assisted device alteration (LADA) is provided, the method comprising: obtaining clock signal from the ATE and applying the clock signal to the DUT; obtaining a test loop signal and applying the test loop signal to the DUT; applying a first feedback loop to a pulsed laser source to generate laser pulses at repeatable rate; applying the clock signal to a second feedback loop to synchronize the laser pulses to the clock signal; and directing the laser pulses onto desired areas of the DUT. The first and or second feedback loops may comprise a phase locked loop having an external reference signal. The external reference signal may comprise the clock signal. The laser pulses may comprise picosecond to femtosecond laser pulses. The pulsed laser source may be operated to generate laser pulses having wavelength selected to generate single-photon laser assisted device alteration. The pulsed laser source may be operated to generate laser pulses having wavelength selected to generate two-photon laser assisted device alteration. Directing the laser pulses may comprise scanning the laser pulses over a desired area of the DUT.

According to other embodiments, a method for testing an integrated device under test (DUT) that is coupled to an automated testing equipment (ATE) using laser assisted device alteration (LADA) is provided, the method comprising: using a fixed-pulse laser source to generate laser pulses at a designated pulse rate; obtaining pulse rate signal from the fixed-pulse laser source and generating clock signal therefrom; applying the clock signal to the ATE and generating a test loop signal by the ATE and applying the test loop signal to the DUT; and directing the laser pulses onto desired areas of the DUT. The method may further comprise varying the phase of the clock signal with respect to the pulse rate signal.

According to further embodiments, a method for measuring carrier lifetime in a semiconductor device under test (DUT) using laser assisted device alteration (LADA) technique is provided, comprising: repeatedly applying electrical test signal to the DUT; using a laser beam to illuminate a sensitive transistor in said DUT, so as to obtain an optimum LADA signal, thereby obtaining spatial coordinates of the sensitive transistor; using a pulsed laser source to generate laser pulses and illuminating the sensitive transistor using the spatial coordinates to direct the laser pulses; varying timing of the laser pulses and recording strength of the LADA signal for each timing position until the strength of the LADA signal has reached zero; and determining the carrier lifetime by calculating a time period taken for the LADA signal to change from maximum to minimum signal. The laser beam for determining the spatial coordinates may be obtained from a continuous-wave (CW) laser source. The step of calculating the time period may comprise plotting the LADA signal strength vs. time. The method may further comprise a step of directing the laser pulses at the spatial coordinates and varying the timing until optimum LADA signal strength is obtained, so as to determine the pulse timing for maximum laser pulse overlap with test signal overlap.

BRIEF DESCRIPTION OF DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2B illustrates an embodiment using a fixed-pulsed laser source to generate clock signal.
FIGS. 4A-4C illustrate how pulsed laser LADA helps individually identify and isolate both the P- and NMOS transistor locations in close proximity.
FIGS. 5A-5D illustrate enhanced spatial resolution as a consequence of accurate pulse placement capabilities.
FIG. 6 illustrates an embodiment of laser repetition rate locking scheme.
FIGS. 7A-7C illustrate steps taken to measure minority carrier lifetime using LADA, according to one embodiment.

DETAILED DESCRIPTION

Figure 1:
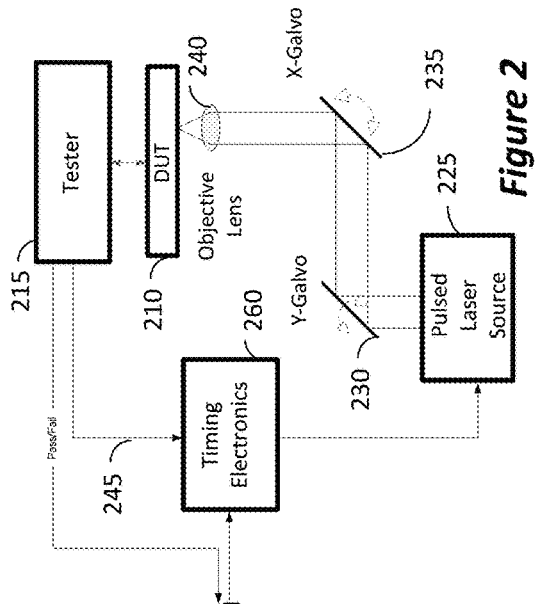
FIG. 1 illustrates a prior art CW LADA system.
Figure 2:
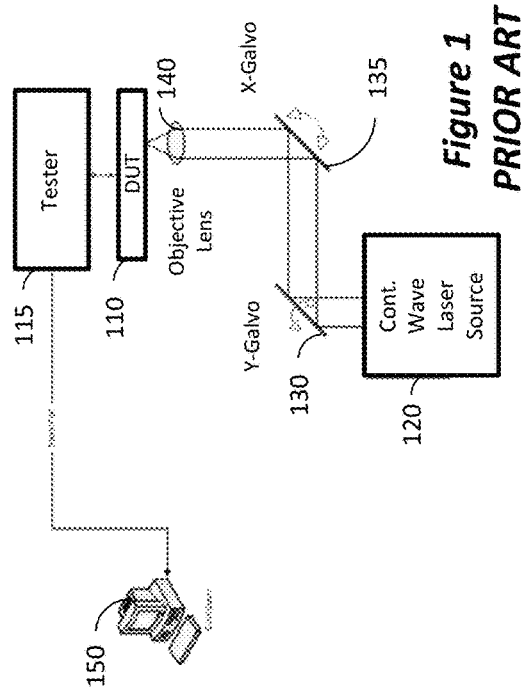
FIG. 2 illustrates an embodiment of pulsed-laser LADA system.

FIG. 2 illustrates an embodiment which uses a pulsed laser source with sufficient energy in lieu of a continuous wave laser. This embodiment concerns applying photon absorption to precisely inject carriers into an IC for the purposes of fault localization using the LADA technique and can be used for IC characterization and finding ways to improve the design. The technique is based on photons arriving at a focus in the transistor so that the delivered photon energy is greater than what is needed for electron hole pair creation (>1.1 eV in silicon, for example; other ICs such as GaAs, SiGe, InP, etc, have different bandgap energies). Photon stimulation in this embodiment requires excitation with laser pulses in the range of nanoseconds to femtoseconds. The signal is localized to the focal spot of the laser, providing an immediate improvement in fault localization. The effective volume in which the electron-hole pair generation occurs seems to be reduced due to the synchronization. The embodiments use sophisticated timing electronics to precisely control the timing of the laser pulse with respect to the transition of an edge of the tester clock, e.g., ATE clock. This type of control allows to finely vary the delay or advance of signals propagating through the transistor of interest for LADA.

FIG. 2 illustrates an embodiment of the invention, wherein a DUT 210 is coupled to an ATE 215, as in the prior art. However, in the embodiment of FIG. 2, nanosecond to femtosecond laser pulses are generated by pulsed laser source 225, which are then focused onto the DUT 210 using tiltable mirrors 230 and 235 and objective lens 240. For 2pLADA the laser source 225 provides a pulsed laser beam of wavelength that is longer than the silicon bandgap, i.e., longer than 1107 nm. In one embodiment wavelength of 1550 nm is used, while in another 1340 nm or 1250 nm are used. On the other hand, the same arrangement can also be used for single-photon LADA, in which case the laser source can provide pulsed beam of wavelength such as 1064 nm. In this embodiment, the tiltable mirrors 230 and 235 are implemented as a laser scanning microscope (LSM). Also, in some embodiments a solid immersion lens (SIL) is used as part of the objective lens arrangement 240.

In conventional LADA systems the laser is always on; however, according to embodiments of the invention, very short pulses are used. Therefore, it is important that the device transition occurs when the laser pulse arrives at the device. To achieve that, a trigger signal 245 is obtained from the ATE and input to timing electronics 260, which controls the pulsed laser 225 to synchronize the laser pulses with the test signals of the ATE.

Using the system shown in FIG. 2, first the tester (ATE) 215 is operated to apply a set of test vectors to determine the marginal settings of the DUT 210. That is, the voltage and frequency of the test vectors are varied to determine the point where the DUT is just about to fail, or has just failed the test, e.g., the DUT is failing the test 50% of the times of a test loop. This is the DUT's pass/fail boundary condition. The voltage and frequency settings are then used to generate a repetitive test signal to repeatedly stimulate the DUT at its pass/fail boundary condition.

As the DUT is stimulated at the boundary condition, a sync signal 245 is sent from the tester 215 to the timing electronics 260. The timing electronics 260 controls the laser source 225 to obtain laser pulses of picosecond to femtosecond pulse width and of wavelength higher than silicon band gap for 2pLADA or shorter for single-photon LADA. In general, for 2pLADA the wavelength is about 1250 nm to 1550 nm and the pulse width is about 100 fs. For single-photon LADA the wavelength may be 1064 nm and the pulse width is about 100 fs. The laser pulses are scanned over an area of interest in the DUT 240 to thereby increase or decrease the DUT's switching time and push the DUT beyond the boundary condition. That is, if the voltage/ frequency of the test vector are set such that the DUT is just about to fail, the laser pulses are timed to cause the DUT to fail. Conversely, if the voltage/frequency of the test vector are set such that the DUT is just failing, the laser pulses are timed to cause the DUT to pass the test. During this time the output of the DUT is monitored to determine location of the failure. That is, at the moment in time where the output signal from the DUT indicates a failure (where without the laser beam the DUT would pass), the location of the beam over the DUT is determined, to thereby determine the location of the transistor causing the failure. Conversely, at the moment in time where the output signal from the DUT indicates a pass (where without the laser beam the DUT would fail), the location of the beam over the DUT is determined, to thereby determine the location of the transistor previously causing the failure and now passing.

It should be appreciated that since a sync signal is obtained from the tester, the timing of the laser pulses can be varied so as to vary the amount of the photo-generation (single-photon or two-photon) effect on the transistor. That is, the timing of the laser pulses can be varied so as to increase or decrease the amount of increase or decrease the DUT's switching time. This ability can assist in determining the severity of the fault, in addition to its location.

Figure 2A:
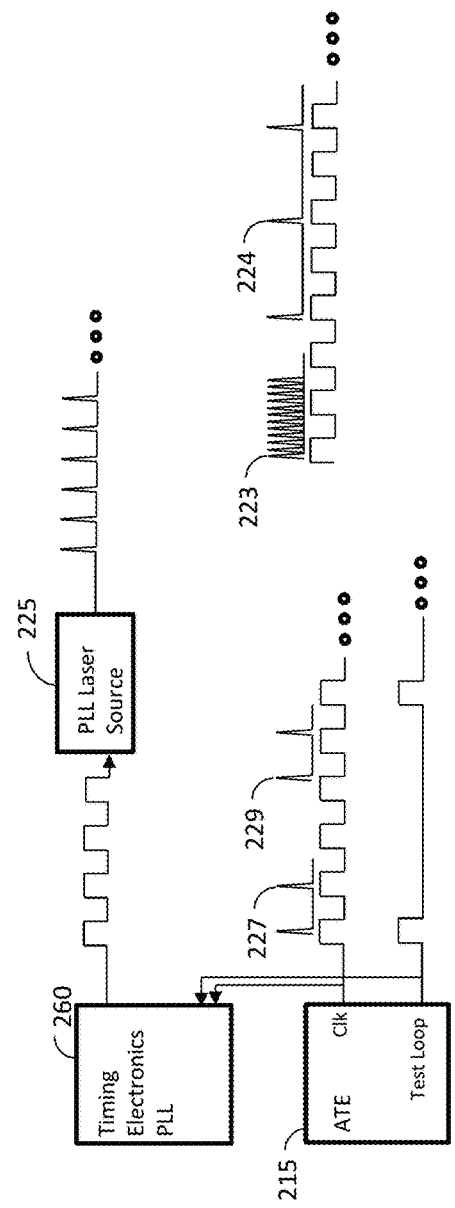
FIG. 2A illustrates an embodiment of the two feedback loops.

Embodiments of the invention also use timing electronics to precisely control the timing of the laser pulse with respect to the transition of an edge of the tester (e.g., ATE) clock. This type of control allows to finely vary the delay or advance of signals propagating through the transistor of interest. In one example, two phase locked loops (PLL) are used to precisely control the pulsed laser, as illustrated in FIG. 2A. In FIG. 2A the ATE 215 provides a clock signal, Clk, and a test loop signal, Test Loop. Both clock signal and test loop signal are input to the DUT and are tapped and sent to the timing electronics 260, which forms the first PLL. The laser source 225 includes a second PLL.

That is, the PLL of the laser source 225 ensures that the pulse frequency of the laser pulses is stable and accurate to the desired frequency, e.g., 100 MHz. Conversely, the first PLL of the timing electronics provides synchronization of the frequency of the second PLL to the clock signal of the ATE. Notably, in this context, synchronization does not necessarily mean that the laser pulses and the clock pulses are concurrent, but rather that they are synchronized over a test loop period. So, for example, the timing of the laser pulses may be shifted, such that the pulses appeal at the middle of the clock signal for every clock pulse, as illustrated by pulse train 227, or at the end of each clock pulse, as shown by pulse train 229, etc. That is, the laser pulses may be delayed or advanced with respect to the clock signal of the ATE, but remain synchronized to the clock signal of the ATE.

On the other hand, as will be elaborated below, the frequency of the laser pulses may be a multiple of the ATE clock signal. For example, laser pulse train 223 has a multiplier of 7, such that seven laser pulses are generated for every one clock pulse of the ATE. Using a multiplier larger than 1, one can probe whether the failure is at the rising edge, trailing edge, etc. Also, it is not necessary to provide delay or shift of the pulses, since the plurality of laser pulses for each clock pulse serve the advance/delay function. Conversely, it is also possible to have a multiplier smaller than 1. For example, in the pulse train 224 the multiplier is ½, such that a laser pulse arrives only every other clock signal. Such an arrangement can be used to validate that the failure is indeed due to the laser pulses, since if it is due to the laser pulses, then the device would fails about 50% of the time.

Figure 3:
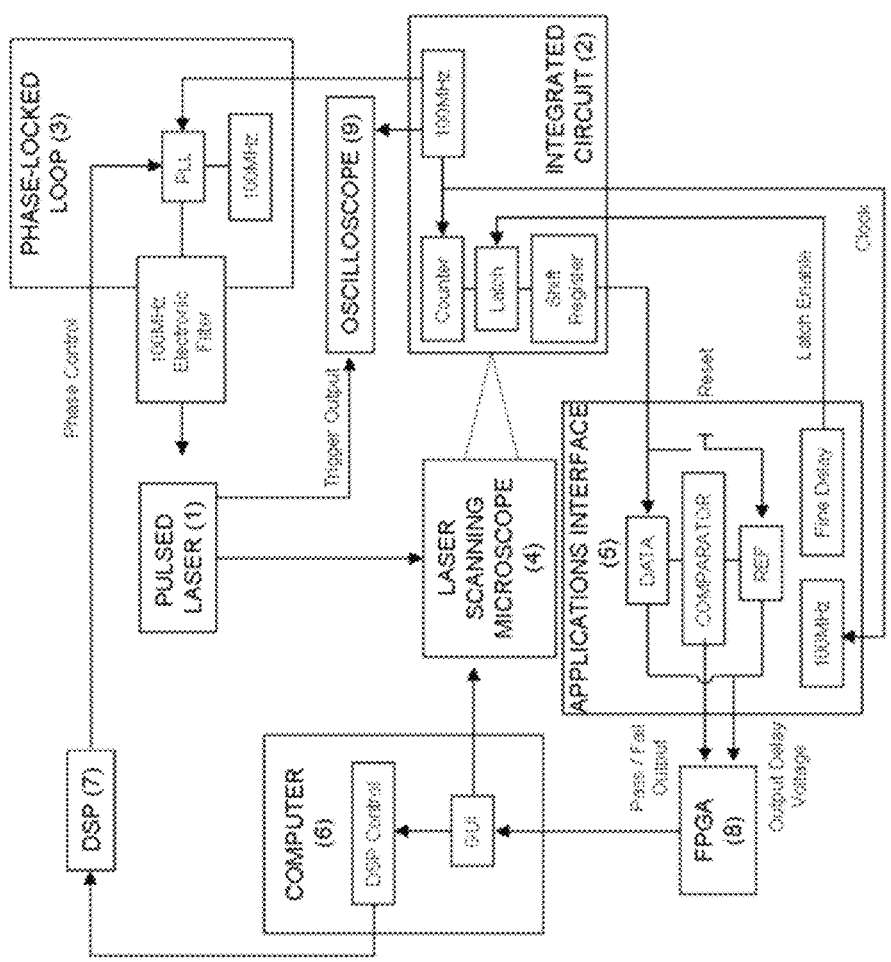
FIG. 3 illustrates an embodiment to achieve a synchronization scheme.

FIG. 3 illustrates an embodiment to achieve a synchronization scheme. The output pulses from a pulsed laser source (1) of nano-to-femtosecond temporal duration can be synchronized to the clock cycle of an integrated circuit (IC) (2) through an intermediary phase-locked loop (PLL) circuit (3). In this configuration, the PPL circuit accepts the clock cycle frequency of the IC and locks it to an internal crystal oscillator of the same frequency. In this embodiment, the clock and crystal oscillator frequencies are fixed at 100 MHz. The IC clock signal can be generated by the ATE (not shown). This enables a 1:1 optical pulse to transistor-switching-event synchronization ratio. Under these conditions, practically speaking, these values can be fixed anywhere in the range from 1 kHz to 10 GHz, before the efficiency of the photon absorption rate becomes severally diminished.

It is noted here that optical sources faster than 1 GHz are not desirable for nonlinear studies such as with 2pLADA, since in general the peak optical power contained with each pulse is inversely proportional to the repetition rate. Therefore, high repetition rates equal low peak optical powers which results in ineffective, if any, two-photon absorption. For 1:1 synchronization ratio single-photon studies at 1064 nm on the other hand, multi-GHz optical sources may be beneficial since the optoelectronic interaction scales linearly with incident optical power. In addition, it should be noted that the efficiency of two-photon absorption is directly proportional on the incident pulse duration, where femtosecond optical pulses facilitate higher peak optical powers than a picosecond or nanosecond alternative and therefore providing improved nonlinear absorption. As a result, it is desirable for nonlinear studies to utilize ultrafast (i.e. picosecond or femtosecond) optical pulses. On the other hand, for single-photon studies, the pulse duration is not a limiting parameter with regard to absorption rate and so does not restrict performance. If anything, it enables an additional probing parameter (e.g. for measuring optical pulse interaction periods vs. photoelectric device stimulation). Furthermore, the silicon absorption coefficient is greater for single-photon wavelengths <1130 nm compared to two-photon-absorption-tuned wavelengths (i.e. □□>1250 nm).

In order to maintain the efficiency, one can modify the synchronization scheme in order to match integer multiples of incident optical pulses to transistor switching events (or device clock frequencies). For this to succeed, the laser source must be designed to produce a higher than 1 GHz repetition rate and have a scalable pulse picker module in place, post pulse optimization, in order to amend the synchronization ratios. For example, instead of matching each incident optical pulse to every transistor switching event, one could match every second pulse to every subsequent switching event; thus, creating a 2:1 synchronization ratio. Practically, this would translate into the use of a 200 MHz repetition rate laser and a 100 MHz device frequency, or a 1 GHz repetition rate laser and a 500 MHz device frequency, and so on. Alternatively, one could tune the ratio to be 3:1 or 4:1, etc., so long as the ratio corresponds to an optoelectronic overlap with the clock pulse in synchronization with the test loop signal. Under this synchronization scheme, the efficiency of photon absorption is not decreased; however, the rate at which absorption takes place does, generating a photon signal intensity that is negatively scaled as per the synchronization ratio. It must be noted here that this may not be a limiting factor for laser-induced studies of integrated-circuits. For each device under test, there is a requirement to perform a photon scalability calibration in order to determine the maximum synchronization ratio allowed. Furthermore, by integrating a tunable optical source (i.e. 1000-1600 nm output wavelength) into such a system, one can interchange between single-photon and two-photon absorption regimes since two-photon absorption begins to dominate over single-photon absorption at wavelengths larger than about 1200 nm in silicon.

Once these frequencies (i.e. the clock and crystal oscillator frequencies) are locked together, the PLL circuit output signal is then sent through a 100 MHz (or clock frequency) electronic filter to the pulsed laser to serve as its input stimulus. The benefit here is that the PLL circuit has full control over the phase of its output signal. Therefore, one can control the repetition rate, and hence the pulse arrival time, of the laser's optical output. This can be verified by comparing the output clock frequency from the IC to the trigger output from the pulsed source on an oscilloscope (9). In this example the PLL circuit can electronically accommodate phase delays of about 600 fs; however, due to the board's electrical jitter, a minimum phase delay is set to about 20 ps. The system's electrical jitter is directly proportional to the accuracy at which the optical pulses can be positioned relative to the switching time of the individual transistors under evaluation. Therefore, since the system's electrical jitter is 20 ps, the optical placement accuracy is also 20 ps—there is a one-to-one correspondence. This is a crucial parameter since it can negate the timing benefits to be gleaned if the electronic placement error is larger, for instance, than the 2pLADA femtosecond pulse duration. Femtosecond optical pulses increase the local energy density as required for efficient two-photon absorption; however, when the electrical jitter eclipses this isolated carrier generation timescale then the jitter can limit the subsequent signal generation and temporal precision of the now time-resolved data.

The laser pulses are then coupled into a laser scanning microscope (LSM) (4) where they can be accurately distributed across a particular location on the IC. The LSM is controlled using a computer (6) which hosts a graphical user interface as well as a custom digital signal processor (DSP) suite. In disclosed embodiments, this applications suite gives the end user, through a preconfigured DSP circuit (7), the ability to directly communicate with the PLL circuit which in turn provides full control over the laser pulse's arrival time at the device, e.g., by delaying or advancing the pulses.

With regard to the device 2, it can be electrically stimulated to produce preconditioned LADA pass/fail values through the use of a custom applications interface (5). This board compares a real-time acquisition value from a counter, latch and shift register arrangement against a loaded reference value which was inserted beforehand by selecting a reset switch. Fine control over the real-time loaded counter value can be controlled through an analog fine delay potentiometer on the applications interface board which alters the timing of the latch enable function on the IC. This configuration allows the user to condition predominantly passing, failing or balanced comparator output values. These pass/fail output values are then sent to a data conditioning circuit (in this example, a field-programmable gate array FPGA 8) which is programmed to accept a real-time digital pass/fail stimulus, conditioned to scale between failing values from 0-100%, and delivers an averaged (about 40 us period) digital output, again scaled between 0-100% fail, for enhanced visualization and biasing of the resulting pass/fail levels in the graphical user interface. The data conditioning circuit can also be used in conjunction with the applications interface board in order to calculate the magnitude of laser-induced timing delays by calibrating the application board's output delay voltage.

In the embodiments described above, a tunable pulsed laser source is used, and the pulse frequency is tuned so as to synchronize to the ATE clock. While these embodiments are operable, a tuned pulsed laser source is rather expensive and requires the phase locked loop described above. FIG. 2B illustrates another embodiment, which enables LADA testing using a simpler fixed pulsed laser 255. For example, a mode-locked laser source can be used. Mode-locking is a technique in optics by which a laser can be made to produce pulses of light of extremely short duration, on the order of picoseconds or femtoseconds. The laser pulses are used as the clock, which is fed to the timing electronics 265. Conventional ATE's have clock input port and are programmable to use the input clock in order to generate the clock, Clk, and the test loop signals for the DUT. Therefore, in one example, the clock signal from the timing electronics 265 is input to the ATE, and the ATE is programmed to use that input to generate the clock and test loop signal.

However, as noted above, to obtain the most benefit of the pulsed laser LADA, it is desirable to adjust the pulses such that the laser pulses arrive at the transistor at different times during the clock cycle, e.g., leading edge, middle, trailing edge, etc. In the embodiments of FIGS. 2, 2A and 3, this was done by advancing or retarding the laser pulses. However, in the embodiment of FIG. 2B the laser pulses are fixed and cannot be changed, so retarding or advancing the laser pulses is not a viable option. Therefore, according to one embodiment, the ATE is programmed to retard or advance its clock signal in synchronization with the clock signal received from the timing electronics 265. In this manner, the timing of the arrival of the laser pulses at the transistor can be tuned to leading edge, trailing edge, etc., of the ATE clock signal.

On the other hand, since in general the ATE and the LADA testers are made by different manufacturers, and the actual testing is performed by an engineer from yet a third company, it would be beneficial to simplify the operations of the testing engineer and offload the retardation or advancement of the signal from the ATE. This is done by using the phase shifter 275, illustrated in the embodiment of FIG. 2B. That is, using the phase shifter 275, the clock signal output from the timing electronics 265 can be advanced or retarded with respect to the laser pulses. The resulting modified signal is then sent to the ATE as the input clock signal. Consequently, when the ATE output its clock and test loop signals, they are both can be shifted or retarded with respect to the laser pulses.

EXAMPLES

Constructing a pulsed LADA system with a pulsed optical source allows for novel aspects of the operating device to be evaluated and measured. When traditional single-photon or alternative two-photon LADA utilize a CW laser, the optical radiation is constantly interacting with the individual transistors with a potentially damaging level of invasiveness. A pulsed LADA methodology, on the other hand, allows the switching characteristics of the individual transistors to be mapped out in as much as two-physical dimensions. Extended pulsed LADA concepts are discussed in detail below.

Under conventional CW LADA stimulation, device theory and practice informs us that the magnitude of laser-induced device perturbations from a p-type metal-oxide-semiconductor (PMOS) transistor dominates over its n-type (NMOS) neighbor. Since the diameter of the laser beam would cover both the p-type and its neighboring n-type transistors, the resulting spatial resolution is insufficient to distinguish the failing transistor. On the other hand, using the disclosed embodiments in a pulsed arrangement, temporal resolution is used to achieve higher spatial resolution, even when a larger wavelength laser is used. That is, since the incident pulses are tuned to the exact temporal switching interval of the transistors under investigation, and also because the peak power contained in each pulse is significantly higher than in CW mode, it is possible to individually identify and isolate both the P- and NMOS transistor locations in close proximity. This is impossible under CW excitation and therefore creates a new experimental avenue for semiconductor device design debug and characterization to explore, even at increasingly small design rules. This addresses a growing concern within the semiconductor device failure analysis community where optically-induced transistor recognition and operating characteristics are of critical importance as the latest technology nodes are scaled toward lower nanometer geometries. Consequently, synchronized pulsed LADA offers more value than its CW counterpart.

A schematic example of such improvements is presented in FIGS. 4A-4C. In continuous-wave mode, the PMOS signal generally dominates, resulting in a generalized spatial distribution of a single signal, as illustrated in FIG. 4A. It is incredibly difficult here to discern individual physical transistor distributions and/or match these LADA manifestations to computer-aided design (CAD) layouts. Theoretically, each transistor should generate its own LADA signal—no matter the magnitude of the laser-induced effect, as illustrated in FIG. 4B. These would perfectly trace out the physical location of the individual transistors allowing for rapid physical and/or optoelectronic recognition. This can be replicated in the pulsed domain using the embodiments discussed above. That is, the laser pulses are timed and synchronized to the test signal, such that they arrive at the P- and NMOS transistor locations according to the user's selection. The pulses can be timed to the switching of the PMOS transistors to test them, or to the switching of the NMOS to test the NMOS transistors, as illustrated in FIG. 4C. Therefore, unique transistor switching evaluations as well as CAD-enhanced physical mapping/recognition of LADA signals can be performed, regardless of the spatial laser coverage.

Furthermore, an additional benefit of the increased peak power from ultrafast pulses (aside from the ability to generate LADA signals more efficiently, i.e., acquiring fewer image averages) is the generalized increase/decrease (depending on whether you perturb a P- or N-MOS transistors) in laser-induced critical timing path perturbations and therefore improved LADA signal collection. Larger incident optical power increases the number of photo-injected carriers within the silicon, which in turn enhances the probability of stimulating optoelectronic fluctuations within the device structures. This leads to superior LADA signal responses which can be more readily measured with a reduced level of invasiveness—pulsed optical sources are actually off for longer than they are on, limiting the opportunity for thermal build up and damage. For example, an ultrafast laser with a pulse duration of 10 ps and a repetition rate of 100 MHz is off for a duration of 10 ns—creating a ratio of 1:1000 (ON:OFF)—thereby providing ample cooling off period. However, it should be noted that it is ultimately the power ratio that causes the heating. For example, a single optical pulse containing 1 kJ of incident optical energy would satisfy the above criteria however it also contains enough energy to potentially permanently damage the device through some other thermal or non-thermal optoelectronic mechanisms.

Also, with the facility to noninvasively inject significant levels of optical power into a specific transistor comes the opportunity to disturb previously overlooked transistor locations. Naturally, a greater level of photo-carrier generation within the vicinity of a given region of interest (which is populated with transistors of varying sensitivity) increases the probability of visualizing a wider range of LADA manifestation sites. These activation regions can be stimulated with approximately 10-100 uA of laser-induced photocurrent; however, with an ultrafast laser pulse boasting peak optical powers approaching 10-100 kW it may be possible to inject 10-100 mA of photocurrent (while maintaining a safe level of invasiveness) within the device which may be enough to perturb 'healthy' transistors.

Efficient two-photon absorption can be obtained in silicon with a focal laser power density of more than 10 MW/cm2; however, single-photon values will be approximately 106 times smaller due to its relative absorption cross-section. The level of incident optical power (or local power density) required for efficient, non-invasive photo-carrier injection will decrease as the spatial geometries of the transistors under evaluation also decrease. Also the generation of two-photon absorption is not dependent on a specific power density threshold—two-photon absorption is an instantaneous, quantum mechanically defined, nonlinear process which is sensitive to the imaginary part of the third-order nonlinear susceptibility (i.e. it exhibits an intensity-squared dependence, not a power density dependence).

Even though a two-photon wavelength of 1250 nm generates effectively 625 nm inside the silicon (where the absorption cross-section is higher than 1064 nm), the intensity-dependent nature of the absorption process reduces its overall relative rate of absorption. Two-photon absorption is directly proportional to the square of the incident optical intensity. In addition, silicon doping levels also contribute to this discussion—i.e. increased or decreased doping concentrations affect the level of absorbance as a function of wavelength. This single-photon-biased opportunity however enables another novel laser-probing and device characterization platform for enhanced critical timing analysis of racing/switching signal levels within transistors. CW LADA cannot offer this type of interrogation due to limitations from invasiveness (i.e. the laser—is always on) and limited power delivery capabilities. Time-resolved pulsed probing, on the other hand, may allow failure analysts to investigate, for the first time, transistor switching physics on healthy, design-defined nodes as well as the subsequent down-chain device performance/interactions also. In order to effectively implement this type of device characterization, an understanding of the level of incident optical power required plays an important role. Perturbing 'healthy' transistors requires high peak powers while facilitating a minimal level of invasiveness. With that said, optimization of the temporal duration of the incident optical pulses is required. Clearly, picosecond pulse durations at 1064 nm provide significant levels of incident optical power (hence, photo-carrier generation) at the transistor level since, for example, a 10 ps laser pulse at a repetition rate of 100 MHz and an average power of 4 mW generates a peak power of 4 W; however, this may be limited if the laser repetition rate is matched to a faster than 1 GHz clock frequency from a device under test. Increasing repetition rates results in decreasing peak powers. Therefore, a more suitable alternative is the use of a femtosecond laser source. The laser repetition rate could be scaled in accordance with the device operation frequency while providing enhanced levels of peak optical power since the pulse duration has reduced by a factor of 1000—increasing the peak power by the same magnitude (4 kW in the example given above). An additional benefit of the femtosecond pulse duration would be the improvements in temporal characterization; however, this is restricted by the magnitude of the synchronization scheme's electrical jitter—as described previously. Finally, femtosecond laser pulses provide a reduced level of optical invasiveness compared to picosecond or nano-second pulses, minimizing the potential for laser-induced damage to the device.

In addition, a pulsed LADA system demonstrates enhanced spatial resolution as a consequence of accurate pulse placement capabilities. Again, when in CW mode, the laser continuously stimulates a specific region of interest while inferring LADA information in real-time. This results in a spatially averaged two-dimensional LADA image since there is no discrimination between the highly ordered sequences of circuit functionality (i.e. propagating signal paths vs. time) where a collective distribution is acquired with a PMOS dominated bias. In pulsed mode however, one can discern between these propagating speed paths with an accuracy of about 20 ps, allowing for highly confined LADA signal manifestations which have an enhanced lateral resolution since they individually and temporally address spatially separated neighboring transistors that are not configured to switch until later in the device operational cycle. This enhances the LADA isolation resolution as well as the physical LADA resolution.

A schematic example is presented in FIGS. 5A-5D. In continuous-wave mode, since the spatial distribution of LADA signals is time-averaged, the resulting two-dimensional LADA map has a generalized optoelectronic structure which may be biased according to the individual transistors' LADA signal strengths (since PMOS generally dominates over NMOS). These images, illustrated in FIG. 5A, suffer from poor spatial resolution and limited CAD overlay capabilities. In pulsed mode however, the LADA image can be enhanced and its spatial resolution improved due to the time-resolved nature of the acquisition process. By individually addressing each transistor as a function of both space and time (and with sufficient incident optical power so as to remove any PMOS biasing effects), neighboring transistor influence is effectively removed from perturbing the LADA acquisition since there is now a tester-driven, transistor-dependent sequence of events controlling the device operation. Each transistor is configured to switch in a systematic, time-dependent order, allowing for the incident optical pulse to directly manipulate and measure each transistor in two physical dimensions (i.e. X and Y) as well as time. As a result, the spatial resolution of the acquired LADA signal is improved and therefore additional, previously unobtainable, device data may be extracted, as illustrated in the sequence of FIG. 5B-5D, showing images taken at different times, each with its temporal and spatial separation.

Aside from gleaning only LADA-specific data from this technique, it is also possible to determine additional optoelectronic phenomena as well. One example would be the measurement of laser-induced carrier lifetimes. Currently, the carrier lifetime inside specific device locations is tremendously difficult to quantify since it depends on a number of different optoelectronic parameters, such as material composition, dimensions, geometries and electric-field magnitudes and directions, etc. With pulsed LADA however, one may be able to directly measure this electronic timescale through a pseudo pump-probe type technique where the creation of a transistor-specific LADA event is linked to the arrival time of a laser pulse. The measured carrier lifetime may require the consideration (i.e. subtraction) of the system's electronic response time for a more accurate representation.

When using single-photon LADA, i.e., laser pulses of wavelength 1064 nm, the magnitude of the measured LADA effect is directly proportional to the magnitude of the laser-induced photo-current (this is when using linear absorption, as the LADA signal would respond quadratically with a two-photon technique). According to one embodiment, the LADA signal is mapped out as a function of laser pulse arrival time. Then it would be possible to extract the carrier lifetime, since the lifetime will dictate the magnitude of the resulting LADA signal.

A process for accomplishing this according to one embodiment would be as follows. First, a laser beam (e.g., a CW laser beam of wavelength 1064 nm) is parked to illuminate a sensitive transistor, so as to obtain an optimum LADA signal. This is illustrated in FIG. 7A. The spatial coordinates of the laser beam at the optimum LADA signal indicates the proper spatial coordinates of the transistor. Then the CW laser source is disabled and the pulsed laser source is activated and the laser pulses are directed to the same spatial coordinates obtained from the CW laser. The laser pulse timing is adjusted to obtain and measure the optimum LADA signal, so as to obtain the proper temporal overlap with the tester (e.g., ATE) pulses arriving at the transistor. This is illustrated in FIG. 7B. At this time, the optimized the spatial overlap of the laser spot with the transistor and the temporal overlap of the laser pulses with the test signal have been achieved. Then, the laser pulses arrival time can be adjusted to measure the carrier lifetime. Specifically, the timing of the laser pulses is then varied and the LADA signal strength is recorded for each timing position (e.g., retarded or advanced amount), until the LADA signal has reached zero. The resulting LADA signal strength vs. time response is the plotted, as illustrated in FIG. 7C. The time taken for the LADA signal to change from maximum to minimum signal (or vice versa) corresponds to the measured laser-induced carrier lifetime. The above process is performed while repeatedly applying electrical test signal to the DUT.

Laser Source

Multi-GHz repetition rate laser sources are readily available and are constructed through carefully consideration of their resonator cavity length—i.e. the shorter the oscillating cavity, the higher the repetition rate. Control over the cavity length can be manipulated and locked through the inclusion of a piezo-electric actuator located on the opposite side of an intra-cavity resonator mirror. This is the industry standard technique for repetition rate locking; however, the electronic mixer circuit required to facilitate such a scheme may differ in design and implementation. To properly incorporate the tuned-pulsed laser source into the LADA tester as described in the above embodiments, two feedback loops are required; one to control the repetition rate of the laser pulses and one to synchronize the timing of the pulses to the DUT clock. The first feedback loop, which controls the repetition rate, includes a mixer that compares the free-running repetition rate frequency of the laser to an input clock stimulus in order to produce a high-voltage driven difference signal. The difference signal is input to the piezo-electric transducer to adjust the resonator cavity length, which then adjusts the desired length so that the pulse rate matches the clock input supplied. An example of such a setup is illustrated in FIG. 6. In addition to the circuit described in FIG. 6, a secondary stabilization scheme can be included to continually monitor and correct the output voltage from the proportional-integral amplifier. This ensures that the high voltage amplifier is consistently given the correct input voltage so to provide repetition rate locking stability of a greater period of time— i.e. several days compared to tens of minutes.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A method for altering a switching time of a device under test (DUT), the method comprising:
   determining marginal settings of the DUT;
   applying electrical test signals to the DUT using a tester to apply repetitive test signals based on the marginal settings to repeatedly stimulate the DUT at a pass/fail boundary;
   with a laser source, generating laser beam pulses having sufficient energy to generate electron-hole pairs within the DUT;
   scanning the laser beam pulses onto an area of interest in the DUT;
   controlling the timing of the laser source according to a clock of the tester; and
   wherein incident photon energy of the laser beam pulses is set to be less than a bandgap of material forming a device in the DUT.

2. The method of claim 1, wherein the laser beam pulses are of wavelength longer than 1107 nm.

3. The method of claim 1, wherein the laser beam pulses are of about 100 femtoseconds pulse width.

4. The method of claim 1, wherein controlling the timing comprises controlling the timing of the laser pulses so as to increase or decrease switching time of the DUT.

5. The method of claim 1, wherein controlling the timing comprises controlling the timing of the laser pulses with respect to a transition edge of the tester clock.

6. The method of claim 1, further comprising varying the timing of the laser beam pulses to determine severity of a fault in the DUT.

7. The method of claim 1, wherein:
   the determining marginal settings comprises selecting at least one voltage and at least one frequency; and
   the repetitive test signals are of the selected at least one voltage and the selected at least one frequency.

8. A method for testing a device under test (DUT), the method comprising:
   applying a first set of electrical test signals from a tester to the DUT, so as to determine marginal settings for the DUT;
   setting voltage and frequency of a second set of electrical test signals of the tester according to the marginal settings for the DUT;
   generating electrical DUT output signals by repeatedly applying the second set of electrical test signals from the tester to the DUT;
   during the repeatedly applying, using a laser source to generate laser pulses of wavelength higher than silicon band gap; controlling timing of the laser pulses according to a clock signal from the tester;
   applying the laser pulses to an area of interest in the DUT to thereby generate electron-hole pairs within the DUT; and
   monitoring the electrical DUT output signals to determine location of a failure.

9. The method of claim 8, wherein monitoring the DUT output comprises at each point in time monitoring a pass-fail of the DUT and correlating the pass-fail result to the location the laser pulses illuminate at that point in time.

10. The method of claim 8, wherein the determining the marginal settings comprises determining the voltage and frequency of a test signal such that the DUT is just about to fail the test, or has just failed the test.

11. The method of claim 8, wherein incident photon energy of the laser pulses is set to exactly equal or be greater than half the DUT material bandgap.

12. The method of claim 8, wherein the laser pulses are of wavelength longer than 1107 nm.

13. The method of claim 8, wherein the laser pulses are of about 100 femtoseconds pulse width.

14. The method of claim 8, further comprising varying the timing of the laser pulses to determine severity of a fault in the DUT.

* * * * *

UNITED STATES PATENT AND TRADEMARK OFFICE
CERTIFICATE OF CORRECTION

PATENT NO. : 10,209,274 B2
APPLICATION NO. : 14/922046
DATED : February 19, 2019
INVENTOR(S) : Vedagarbha et al.

Page 1 of 1

It is certified that error appears in the above-identified patent and that said Letters Patent is hereby corrected as shown below:

In the Claims

Column 16,
Line 43, "set to exactly equal or be greater than" should be --set to be exactly equal to or greater than--.

Signed and Sealed this
Thirteenth Day of December, 2022

Katherine Kelly Vidal
*Director of the United States Patent and Trademark Office*